(12) United States Patent
 Tsai et al.

(10) Patent No.: US 12,532,742 B2
(45) Date of Patent: Jan. 20, 2026

(54) SEMICONDUCTOR STRUCTURE

(71) Applicant: United Microelectronics Corp., Hsinchu (TW)

(72) Inventors: Ming-Hua Tsai, Tainan (TW); Hao Ping Yan, Tainan (TW); Chin-Chia Kuo, Tainan (TW); Wei Hsuan Chang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 679 days.

(21) Appl. No.: 17/889,389

(22) Filed: Aug. 16, 2022

(65) Prior Publication Data

US 2024/0038684 A1    Feb. 1, 2024

(30) Foreign Application Priority Data

Jul. 28, 2022   (TW) .................................. 111128340

(51) Int. Cl.
 *H01L 23/00* (2006.01)
 *H01L 23/544* (2006.01)
 *H01L 23/58* (2006.01)

(52) U.S. Cl.
 CPC .......... *H01L 23/562* (2013.01); *H01L 23/544* (2013.01); *H01L 23/564* (2013.01); *H01L 23/585* (2013.01); *H01L 2223/54426* (2013.01); *H01L 2223/5446* (2013.01)

(58) Field of Classification Search
 CPC ..... H01L 23/562; H01L 23/564; H01L 21/78; H01L 23/544
 USPC .......................................................... 257/619
 See application file for complete search history.

(56) References Cited

U.S. PATENT DOCUMENTS

| | | | |
|---|---|---|---|
| 4,928,162 A | 5/1990 | Lesk et al. | |
| 6,876,062 B2 | 4/2005 | Lee et al. | |
| 7,202,550 B2 | 4/2007 | Fu et al. | |
| 7,605,448 B2 | 10/2009 | Furusawa et al. | |
| 8,125,054 B2 | 2/2012 | West et al. | |
| 2002/0106837 A1* | 8/2002 | Cleeves | C04B 35/634 |
| | | | 438/129 |
| 2010/0078769 A1* | 4/2010 | West | H01L 23/562 |
| | | | 257/E23.179 |
| 2012/0299159 A1* | 11/2012 | Chen | G03F 7/70633 |
| | | | 257/E23.179 |

* cited by examiner

*Primary Examiner* — Dale E Page
(74) *Attorney, Agent, or Firm* — JCIPRNET

(57) ABSTRACT

A semiconductor structure including a substrate and protection structures is provided. The substrate includes a die region. The die region includes corner regions. The protection structures are located in the corner region. Each of the protection structures has a square top-view pattern. The square top-view patterns located in the same corner region have various sizes.

18 Claims, 6 Drawing Sheets

SEMICONDUCTOR STRUCTURE

CROSS-REFERENCE TO RELATED APPLICATION

This application claims the priority benefit of Taiwan application serial no. 111128340, filed on Jul. 28, 2022. The entirety of the above-mentioned patent application is hereby incorporated by reference herein and made a part of this specification.

BACKGROUND

Technical Field

The invention relates to a semiconductor structure, and particularly relates to a semiconductor structure having a protection structure.

Description of Related Art

When the wafer is diced, the cracks may be created in the die. If the crack extends into the device region of the die, it will cause damage to the circuit in the device region. Therefore, the seal ring is disposed outside the device region to prevent the crack from extending into the device region of the die. However, how to further prevent the crack from extending into the device region of the die is the goal of continuous efforts.

SUMMARY

The invention provides a semiconductor structure, which can prevent the circuit in the device region from being damaged.

The invention provides a semiconductor structure, which includes a substrate and protection structures. The substrate includes a die region. The die region includes corner regions. The protection structures are located in the corner region. Each of the protection structures has a square top-view pattern. The square top-view patterns located in the same corner region have various sizes.

According to an embodiment of the invention, in the semiconductor structure, the die region may further include a device region. The corner regions are located outside the device region.

According to an embodiment of the invention, in the semiconductor structure, the size relationship of two adjacent square top-view patterns may be an increasing relationship in a direction away from the device region.

According to an embodiment of the invention, in the semiconductor structure, the structures may include a first protection structure and a second protection structure. The second protection structure is located between the first protection structure and the device region.

According to an embodiment of the invention, in the semiconductor structure, the size of the square top-view pattern of the first protection structure may be greater than the size of the square top-view pattern of the second protection structure.

According to an embodiment of the invention, in the semiconductor structure, the protection structures may further include a third protection structure. The third protection structure is located between the second protection structure and the device region.

According to an embodiment of the invention, in the semiconductor structure, the size of the square top-view pattern of the first protection structure may be greater than the size of the square top-view pattern of the second protection structure, and the size of the square top-view pattern of the second protection structure may be greater than the size of the square top-view pattern of the third protection structure.

According to an embodiment of the invention, the semiconductor structure may further include at least one seal ring structure. The seal ring structure is located between the corner region and the device region.

According to an embodiment of the invention, in the semiconductor structure, the seal ring structure may surround the device region.

According to an embodiment of the invention, in the semiconductor structure, the top-view shape of the edge profile of the seal ring structure may be an octagon.

According to an embodiment of the invention, the semiconductor structure may further include dummy insertion structures. The dummy insertion structures are located in the empty region of the device region.

According to an embodiment of the invention, in the semiconductor structure, two adjacent square top-view patterns may have the same size.

According to an embodiment of the invention, in the semiconductor structure, the top-view shape of the corner region may be a triangle.

According to an embodiment of the invention, the semiconductor structure may further include dummy insertion structures. The dummy insertion structures are located in the corner region.

According to an embodiment of the invention, in the semiconductor structure, the dummy insertion structure may be located between the protection structure and the device region.

According to an embodiment of the invention, in the semiconductor structure, the size of the top-view pattern of the dummy insertion structure may be smaller than the size of the square top-view pattern of the protection structure.

According to an embodiment of the invention, in the semiconductor structure, the substrate may further include a scribe line region. The scribe line region is located outside the die region.

According to an embodiment of the invention, the semiconductor structure may further include dummy insertion structures. The dummy insertion structures are located in the empty region of the scribe line region.

According to an embodiment of the invention, the semiconductor structure may further include an alignment mark. The alignment mark is located in the scribe line region.

According to an embodiment of the invention, in the semiconductor structure, the alignment mark may be adjacent to the corner region.

Based on the above description, the semiconductor structure according to the invention includes the protection structures, each of the protection structures has the square top-view pattern, and the square top-view patterns located in the same corner region have various sizes. Therefore, the crack can be prevented from extending into the device region of the die region by the protection structures located in the corner region, thereby preventing the circuit in the device region from being damaged. In addition, the protection structures located in the corner region have the effect of relieving stress.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

Figure 1A:
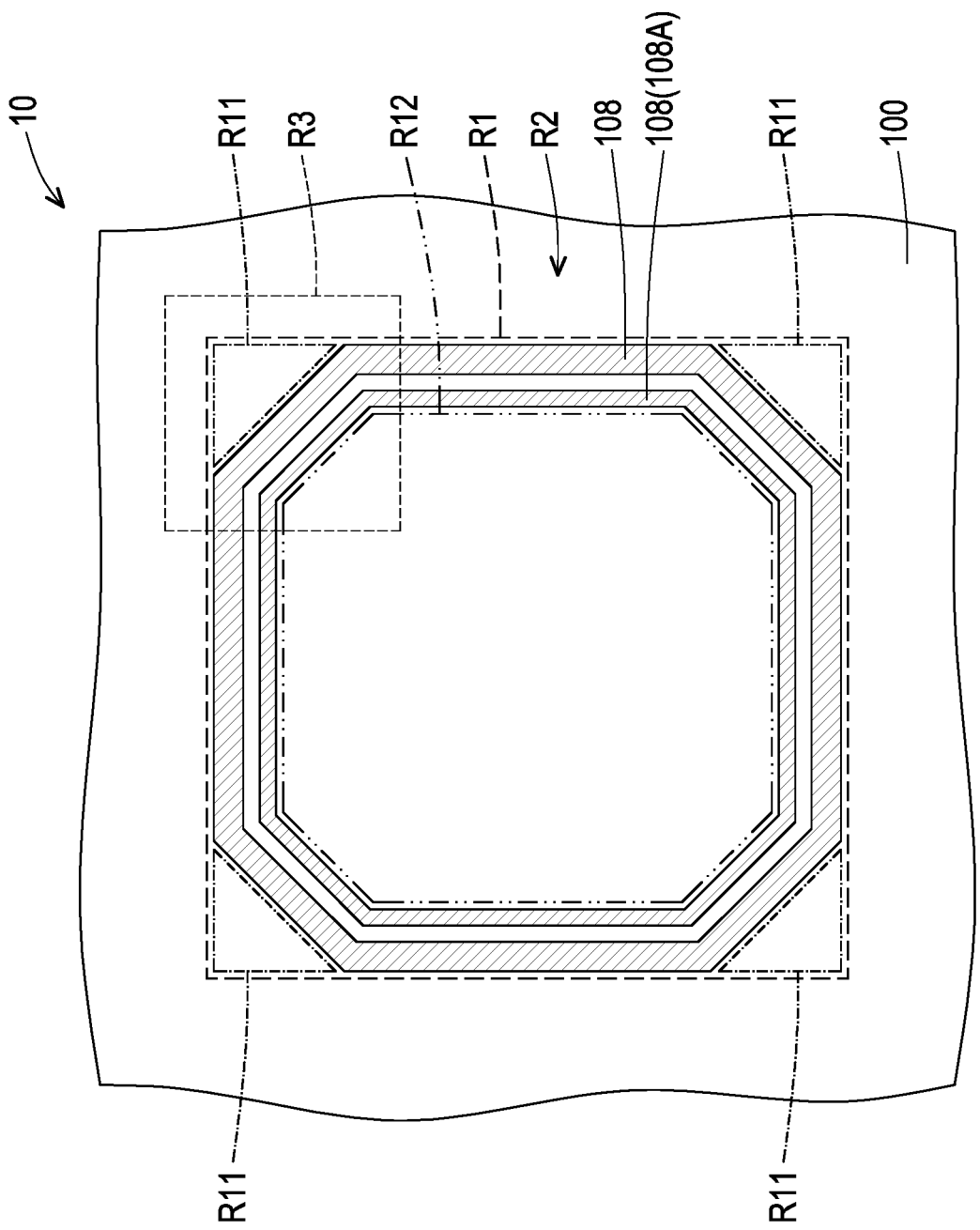
FIG. 1A is a top view illustrating a semiconductor structure according to some embodiments of the invention.
Figure 1B:
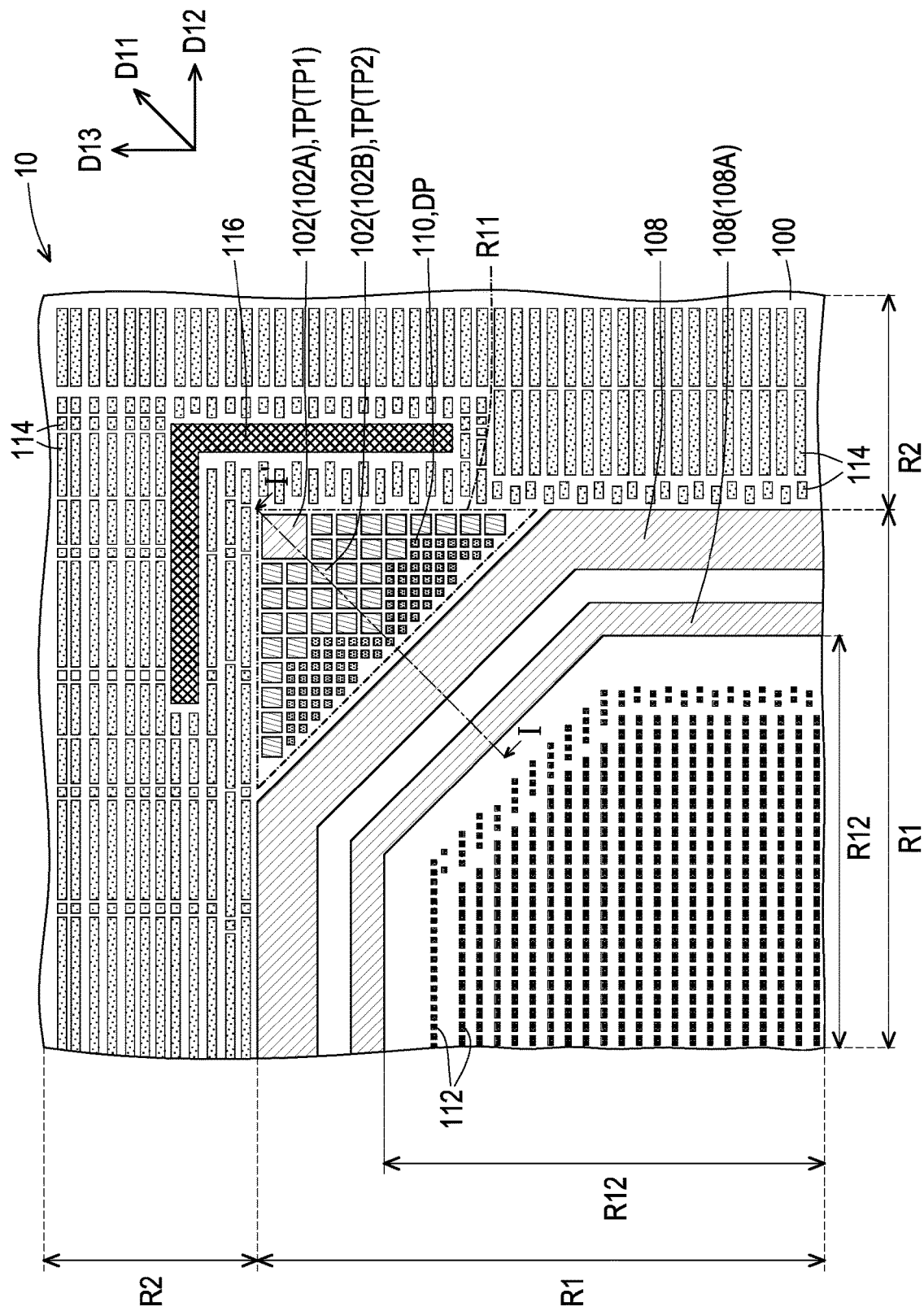
FIG. 1B is a partially enlarged view of the region R3 in FIG. 1A.
Figure 1C:
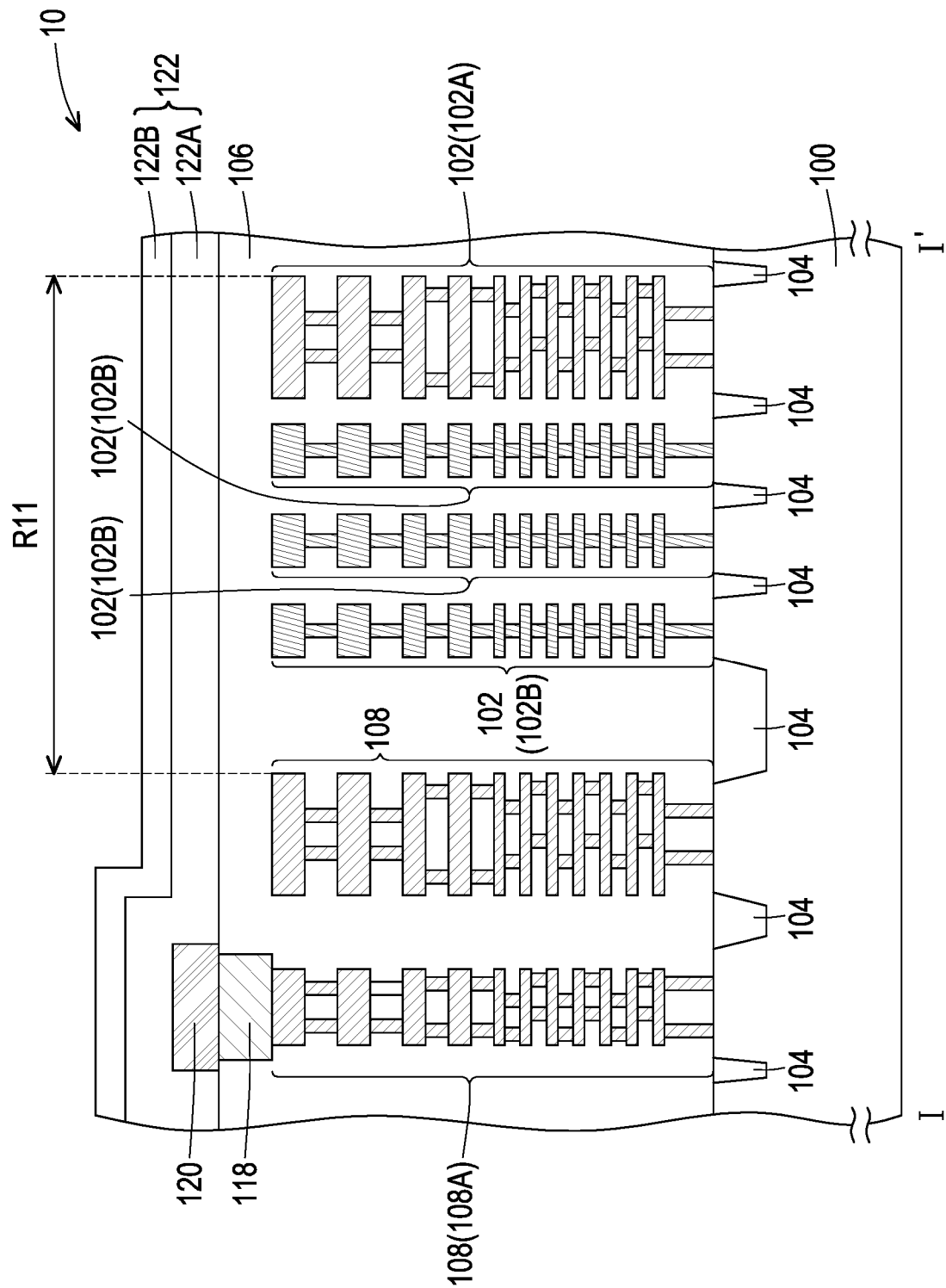
FIG. 1C is a cross-sectional view taken along section line I-I' in FIG. 1B.

FIG. 1A is a top view illustrating a semiconductor structure according to some embodiments of the invention. FIG. 1B is a partially enlarged view of the region R3 in FIG. 1A. FIG. 1C is a cross-sectional view taken along section line I-I' in FIG. 1B. In the top view of the present embodiment, some components in the cross-sectional view may be omitted to clearly illustrate the configuration relationship between the components in the top view. Furthermore, in the cross-sectional view of the present embodiment, some components in the top view may be omitted to clearly illustrate the configuration relationship between the components in the cross-sectional view.

Referring to FIG. 1A, FIG. 1B, and FIG. 1C, a semiconductor structure 10 includes a substrate 100 and protection structures 102. The substrate 100 may be a semiconductor substrate such as a silicon substrate. The substrate 100 includes a die region R1. In some embodiments, the die region R1 may be a region intended to be diced into a die. The die region R1 includes corner regions R11. In some embodiments, the top-view shape of the corner region R11 may be a triangle. In addition, the die region R1 may further include a device region R12. The corner regions Ru are located outside the device region R12. In some embodiments, the top-view shape of the device region R12 may be an octagon, but the invention is not limited thereto. Furthermore, the substrate 100 may further include a scribe line region R2. The scribe line region R2 is located outside the die region R1.

The protection structures 102 are located in the corner region R11. Each of the protection structures 102 has a square top-view pattern TP. The protection structure 102 is disposed on the substrate 100. In the present embodiment, the protection structures 102 may include a protection structure 102A and a protection structure 102B. The protection structure 102B is located between the protection structure 102A and the device region R12. The protection structure 102A may have a square top-view pattern TP1. The protection structure 102B may have a square top-view pattern TP2. In some embodiments, the protection structure 102A and the protection structure 102B may be interconnect structures. In some embodiments, the interconnect structure may include a contact, a via, a conductive line, or a combination thereof. The material of the protection structure 102A and the material of the protection structure 102B are, for example, copper, tungsten, aluminum, or a combination thereof. Moreover, the number of the protection structures 102A and the number of the protection structures 102B are not limited to those in the figure. One of ordinary skill in the art may determine the number of the protection structures 102A and the number of the protection structures 102B according to the product requirement.

In addition, the square top-view patterns TP located in the same corner region R11 have various sizes. In the text, the term "dimension" may refer to the side length or area of the square top-view pattern. For example, the size of the square top-view pattern TP1 of the protection structure 102A may be greater than the size of the square top-view pattern TP2 of the protection structure 102B, so that the square top-view patterns TP located in the same corner region R11 have various sizes. In the present embodiment, the square top-view patterns TP located in the same corner region R11 may have two sizes, but the invention is not limited thereto. In other embodiments, the square top-view patterns TP located in the same corner region R11 may have three or more sizes. As long as the square top-view patterns TP located in the same corner region R11 have various sizes, it falls within the scope of the invention.

In some embodiments, the size relationship of two adjacent square top-view patterns TP may be an increasing relationship in a direction away from the device region R12. For example, the size relationship of the square top-view pattern TP2 and the square top-view patterns TP1 adjacent to each other may be an increasing relationship in a direction D11 away from the device region R12. The size relationship of the square top-view pattern TP2 and the square top-view patterns TP1 adjacent to each other may be an increasing relationship in a direction D12 away from the device region R12. The size relationship of the square top-view pattern TP2 and the square top-view patterns TP1 adjacent to each other may be an increasing relationship in a direction D13 away from the device region R12. In some embodiments, two adjacent square top-view patterns TP may have the same size. For example, two adjacent square top-view patterns TP2 may have the same size.

In some embodiments, the semiconductor structure 10 may further include an isolation structure 104. The isolation structure 104 is disposed in the substrate 100. The isolation structure 104 is, for example, a shallow trench isolation (STI) structure. The material of the isolation structure 104 is, for example, silicon oxide.

In some embodiments, the semiconductor structure 10 may further include a dielectric layer 106. The dielectric layer 106 is disposed on the substrate 100. The protection structure 102 may be disposed in the dielectric layer 106. In some embodiments, the dielectric layer 106 may be a multilayer structure. The material of the dielectric layer 106 is, for example, silicon oxide, silicon nitride, silicon oxynitride, or a combination thereof.

In some embodiments, the semiconductor structure 10 may further include at least one seal ring structure 108. The seal ring structure 108 may be disposed in the dielectric layer 106. The seal ring structure 108 is located between the corner region Ru and the device region R12. The seal ring structure 108 may be located in the die region R1. The seal ring structure 108 may surround the device region R12. In some embodiments, the top view shape of the edge profile of the seal ring structure 108 may be an octagon. In some embodiments, the seal ring structure 108 may be an interconnect structure. In some embodiments, the interconnect structure may include a contact, a via, a conductive line, or a combination thereof. The material of the seal ring structure 108 is, for example, copper, tungsten, aluminum, or a combination thereof. In the present embodiment, the number of the seal ring structures 108 is, for example, two, but the invention is not limited thereto. As long as the semiconductor structure 10 includes at least one seal ring structure 108, it falls within the scope of the invention.

In some embodiments, the semiconductor structure 10 may further include dummy insertion structures 110. The dummy insertion structures 110 are located in the corner region R11. The dummy insertion structure 110 may be located between the protection structure 102 and the device region R12. The size of the top-view pattern DP of the dummy insertion structure 110 may be smaller than the size of the square top-view pattern TP of the protection structure 102. In some embodiments, the top-view pattern DP of the dummy insertion structure 110 may be a square. In some embodiments, the dummy insertion structure 110 may be an interconnect structure. In some embodiments, the interconnect structure may include a contact, a via, a conductive line, or a combination thereof. The material of the dummy insertion structure 110 is, for example, copper, tungsten, aluminum, or a combination thereof. In addition, the number of the dummy insertion structures 110 is not limited to the number in the figure. One of ordinary skill in the art may determine the number of the dummy insertion structures 110 according to the product requirement.

In some embodiments, the semiconductor structure 10 may further include dummy insertion structures 112. The dummy insertion structures 112 are located in the empty region of the device region R12. In some embodiments, the dummy insertion structure 112 may be an interconnect structure. In some embodiments, the interconnect structure may include a contact, a via, a conductive line, or a combination thereof. The material of the dummy insertion structure 112 is, for example, copper, tungsten, aluminum, or a combination thereof. In addition, the number of the dummy insertion structures 112 is not limited to the number in the figure. One of ordinary skill in the art may determine the number of the dummy insertion structures 112 according to the product requirement.

In some embodiments, the semiconductor structure 10 may further include dummy insertion structures 114. The dummy insertion structures 114 are located in the empty region of the scribe line region R2. In some embodiments, the dummy insertion structure 114 may be an interconnect structure. In some embodiments, the interconnect structure may include a contact, a via, a conductive line, or a combination thereof. The material of the dummy insertion structure 114 is, for example, copper, tungsten, aluminum, or a combination thereof. In addition, the number of the dummy insertion structures 114 is not limited to the number in the figure. One of ordinary skill in the art may determine the number of the dummy insertion structures 114 according to the product requirement.

In some embodiments, the semiconductor structure 10 may further include an alignment mark 116. The alignment mark 116 is located in the scribe line region R2. The alignment mark 116 may be adjacent to the corner region R11. In some embodiments, the top-view shape of the alignment mark 116 may be an L-shape. In some embodiments, the material of the alignment mark 116 is, for example, metal.

In some embodiments, the semiconductor structure 10 may further include a via 118. The via 118 is disposed in dielectric layer 106 and on the seal ring structure 108. In some embodiments, the via 118 may be electrically connected to the seal ring structure 108. For example, the via 118 may be electrically connected to the seal ring structure 108A. In some embodiments, the material of the via 118 is, for example, aluminum.

In some embodiments, the semiconductor structure 10 may further include a redistribution layer (RDL) 120. The redistribution layer 120 is disposed on the via 118. In some embodiments, the redistribution layer 120 may be electrically connected to the seal ring structure 108. For example, the redistribution layer 120 may be electrically connected to the seal ring structure 108A by the via 118. In some embodiments, the material of the redistribution layer 120 is, for example, aluminum.

In some embodiments, the semiconductor structure 10 may further include a passivation layer 122. The passivation layer 122 may be a single-layer structure or a multilayer structure. The material of the passivation layer 122 is, for example, silicon oxide, silicon nitride, or a combination thereof. In the present embodiment, the passivation layer 122 may include a passivation layer 122A and a passivation layer 122B, but the invention is not limited thereto. The passivation layer 122A is disposed on the dielectric layer 106 and the redistribution layer 120. The material of the passivation layer 122A is, for example, silicon oxide. The passivation layer 122B is disposed on the passivation layer 122A. The material of the passivation layer 122B is, for example, silicon nitride.

Based on the above embodiments, the semiconductor structure 10 includes the protection structures 102, each of the protection structures 102 has the square top-view pattern TP, and the square top-view patterns TP located in the same corner region R11 have various sizes. Therefore, the crack can be prevented from extending into the device region R12 of the die region R1 by the protection structures 102 located in the corner region R11, thereby preventing the circuit in the device region R12 from being damaged. In addition, the protection structures 102 located in the corner region R11 have the effect of relieving stress.

Figure 2A:
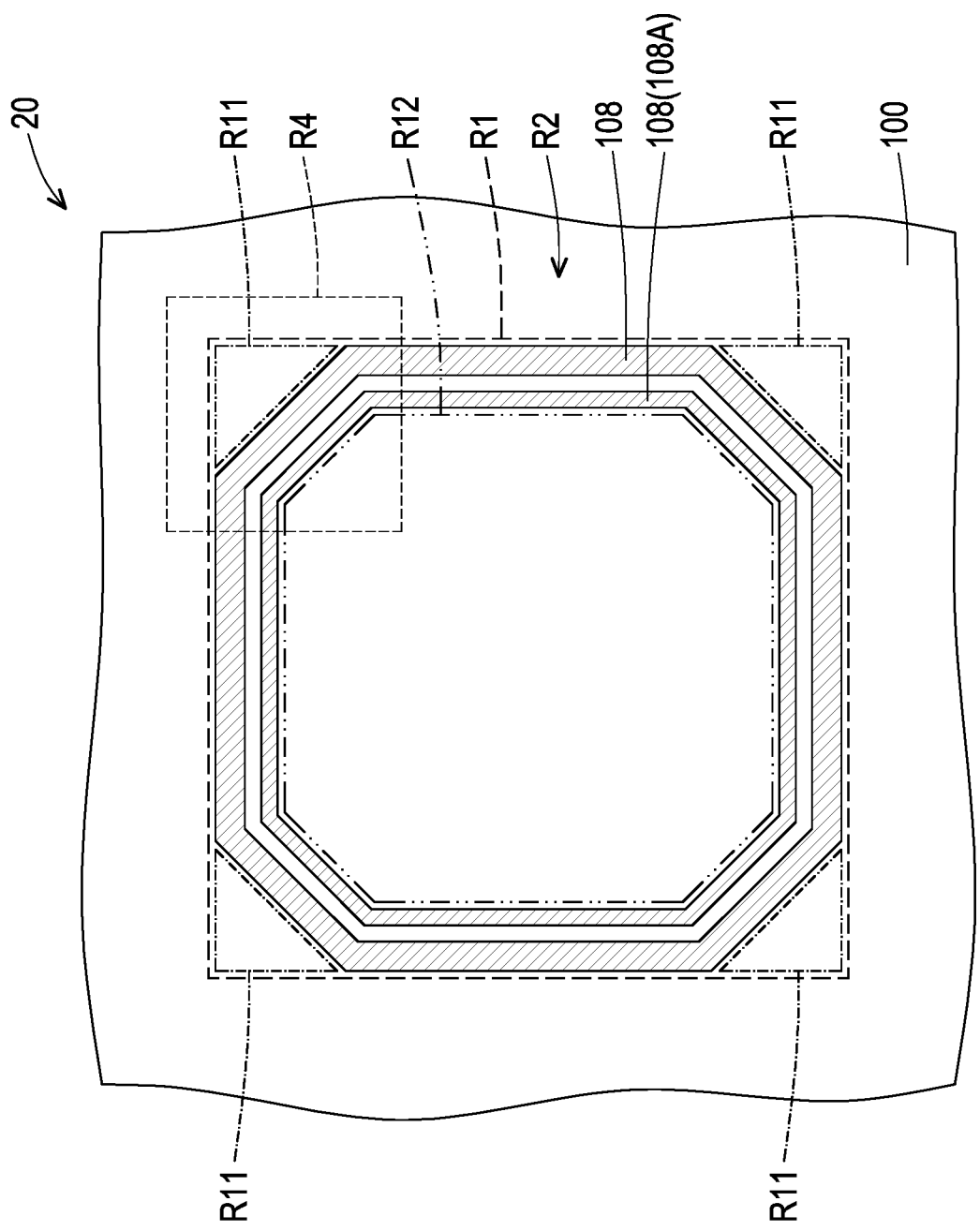
FIG. 2A is a top view illustrating a semiconductor structure according to other embodiments of the invention.
Figure 2B:
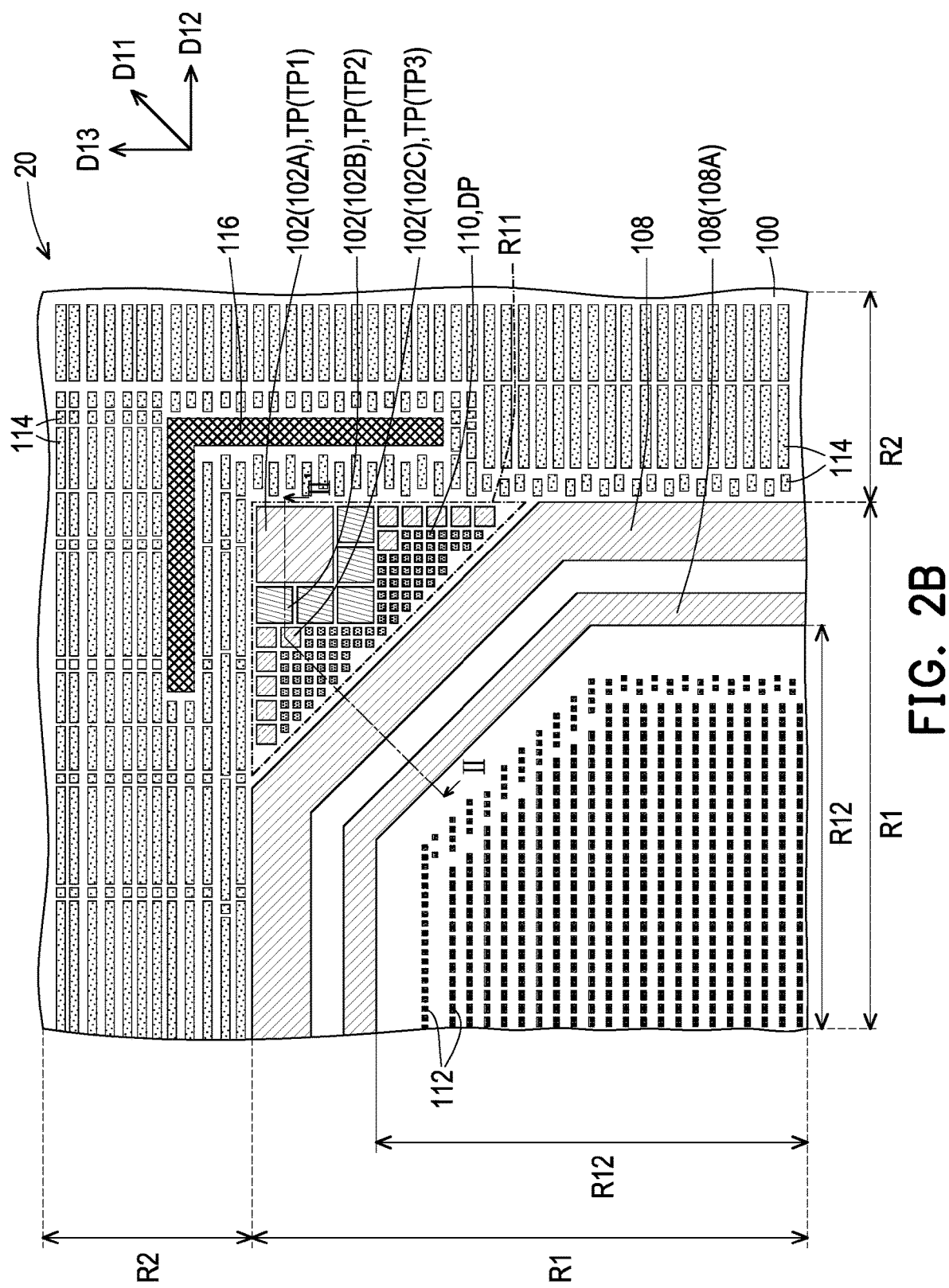
FIG. 2B is a partially enlarged view of the region R4 in FIG. 2A.
Figure 2C:
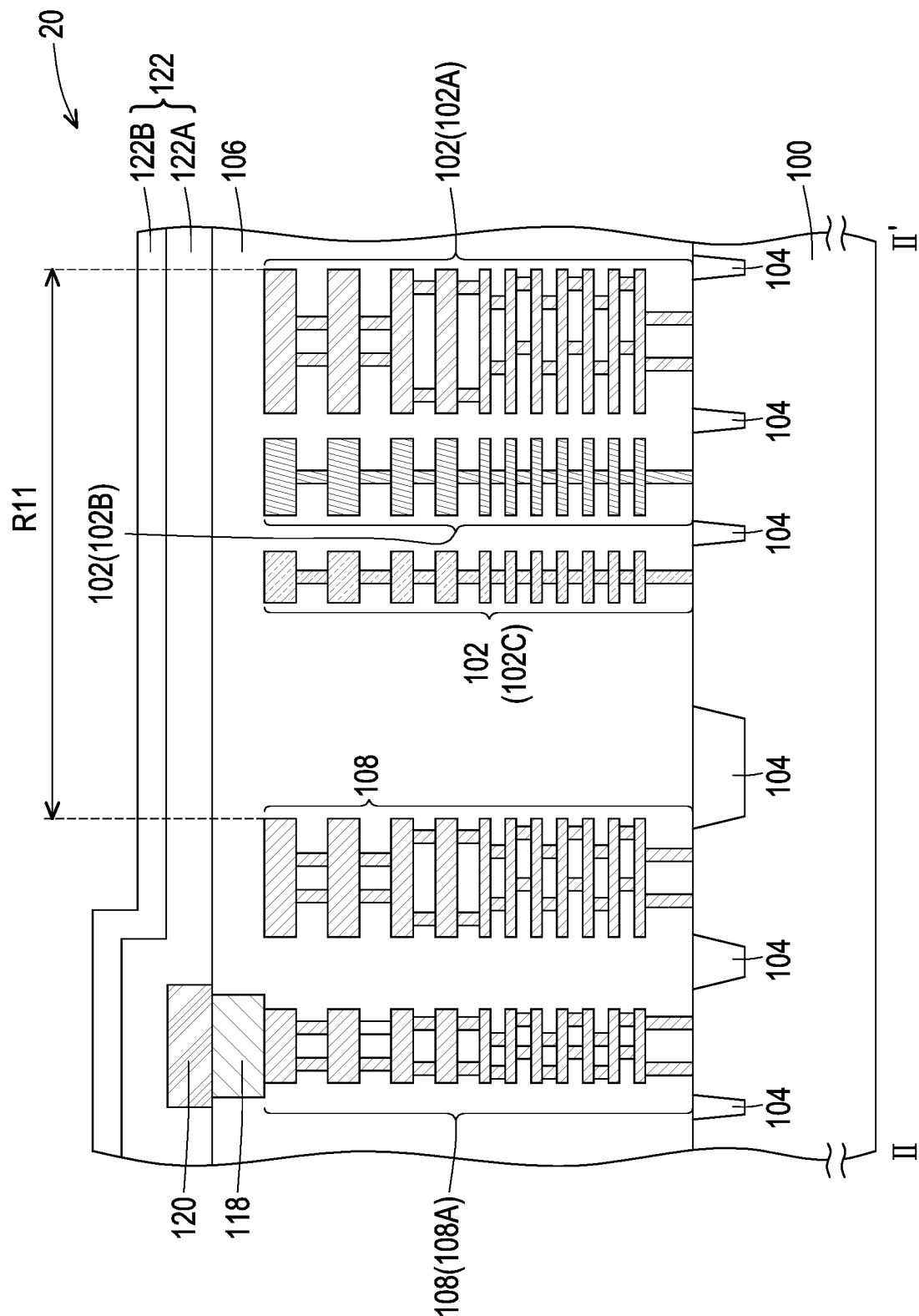
FIG. 2C is a cross-sectional view taken along section line II-II' in FIG. 2B.

FIG. 2A is a top view illustrating a semiconductor structure according to other embodiments of the invention. FIG. 2B is a partially enlarged view of the region R4 in FIG. 2A. FIG. 2C is a cross-sectional view taken along section line II-II' in FIG. 2B. In the top view of the present embodiment, some components in the cross-sectional view may be omitted to clearly illustrate the configuration relationship between the components in the top view. Furthermore, in the cross-sectional view of the present embodiment, some components in the top view may be omitted to clearly illustrate the configuration relationship between the components in the cross-sectional view.

Referring to FIG. 1A to FIG. 1C and FIG. 2A to FIG. 2C, the difference between a semiconductor structure 20 of FIG. 2A to FIG. 2C and the semiconductor structure 10 of FIG. 1A to FIG. 1C is as follow. In the semiconductor structure 20, the protection structures 102 may further include a protection structure 102C. The protection structure 102C is located between the protection structure 102B and the device region R12. The protection structure 102C may have a square top-view pattern TP3. In some embodiments, the protection structure 102C may be an interconnect structure. In some embodiments, the interconnect structure may include a contact, a via, a conductive line, or a combination thereof. The material of the protection structure 102C is, for example, copper, tungsten, aluminum, or a combination thereof. In addition, the number of the protection structures 102C is not limited to the number in the figure. One of ordinary skill in the art may determine the number of the protection structures 102C according to the product requirement.

The size of the square top-view pattern TP1 of the protection structure 102A may be greater than the size of the square top-view pattern TP2 of the protection structure 102B, and the size of the square top-view pattern TP2 of the protection structure 102B may be greater than the size of the square top-view pattern TP3 of the protection structure 102C, so that the square top-view patterns TP located in the same corner region R11 have various sizes. In the present embodiment, the square top-view patterns TP located in the same corner region R11 may have three sizes, but the invention is not limited thereto. As long as the square top-view patterns TP located in the same corner region R11 have various sizes, it falls within the scope of the invention.

In the semiconductor structure 20, the size relationship of two adjacent square top-view patterns TP may be an increasing relationship in a direction away from the device region R12. For example, the size relationship of the square top-view pattern TP2 and the square top-view patterns TP1 adjacent to each other may be an increasing relationship in a direction D11 away from the device region R12. The size relationship of the square top-view pattern TP3 and the square top-view patterns TP2 adjacent to each other may be an increasing relationship in the direction D11 away from the device region R12. The size relationship of the square top-view pattern TP2 and the square top-view patterns TP1 adjacent to each other may be an increasing relationship in a direction D12 away from the device region R12. The size relationship of the square top-view pattern TP3 and the square top-view patterns TP2 adjacent to each other may be an increasing relationship in the direction D12 away from the device region R12. The size relationship of the square top-view pattern TP2 and the square top-view patterns TP1 adjacent to each other may be an increasing relationship in a direction D13 away from the device region R12. The size relationship of the square top-view pattern TP3 and the square top-view patterns TP2 adjacent to each other may be an increasing relationship in the direction D13 away from the device region R12. In the semiconductor structure 20, two adjacent square top-view patterns TP may have the same size. For example, two adjacent square top-view patterns TP2 may have the same size. Furthermore, two adjacent square top-view patterns TP3 may have the same size.

In addition, in the semiconductor structure 10 of FIG. 1 and the semiconductor structure 20 of FIG. 2, the same or similar components are denoted by the same reference symbols, and the description thereof is omitted.

Based on the above embodiments, the semiconductor structure 20 includes the protection structures 102, each of the protection structures 102 has the square top-view pattern TP, and the square top-view patterns TP located in the same corner region R11 have various sizes. Therefore, the crack can be prevented from extending into the device region R12 of the die region R1 by the protection structures 102 located in the corner region R11, thereby preventing the circuit in the device region R12 from being damaged. In addition, the protection structures 102 located in the corner region R11 have the effect of relieving stress.

In summary, in the semiconductor structure of the aforementioned embodiments, each of the protection structures has the square top-view pattern, and the square top-view patterns located in the same corner region have various sizes. Therefore, the crack can be prevented from extending into the device region of the die region by the protection structures located in the corner region, thereby preventing the circuit in the device region from being damaged. In addition, the protection structures located in the corner region have the effect of relieving stress.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
   a substrate comprising a die region, wherein the die region comprises corner regions; and
   protection structures located in the corner region, wherein each of the protection structures has a square top-view pattern, and the square top-view patterns located in the same corner region have various sizes,
   wherein the die region further comprises a device region, and the corner regions are located outside the device region,
   wherein a size relationship of two adjacent square top-view patterns is an increasing relationship in a direction away from the device region.

2. The semiconductor structure according to claim 1, wherein the protection structures comprise:
   a first protection structure; and
   a second protection structure located between the first protection structure and the device region.

3. A semiconductor structure, comprising:
   a substrate comprising a die region, wherein the die region comprises corner regions; and
   protection structures located in the corner region, wherein each of the protection structures has a square top-view pattern, and the square top-view patterns located in the same corner region have various sizes,
   wherein the die region further comprises a device region, and the corner regions are located outside the device region,
   wherein the protection structures comprise:
      a first protection structure; and
      a second protection structure located between the first protection structure and the device region,
   wherein the size of the square top-view pattern of the first protection structure is greater than the size of the square top-view pattern of the second protection structure.

4. The semiconductor structure according to claim 2, wherein the protection structures further comprise:
   a third protection structure located between the second protection structure and the device region.

5. A semiconductor structure, comprising:
   a substrate comprising a die region, wherein the die region comprises corner regions; and
   protection structures located in the corner region, wherein each of the protection structures has a square top-view pattern, and the square top-view patterns located in the same corner region have various sizes,
wherein the die region further comprises a device region, and the corner regions are located outside the device region,
wherein the protection structures comprise:
a first protection structure;
a second protection structure located between the first protection structure and the device region; and
a third protection structure located between the second protection structure and the device region,
wherein the size of the square top-view pattern of the first protection structure is greater than the size of the square top-view pattern of the second protection structure, and the size of the square top-view pattern of the second protection structure is greater than the size of the square top-view pattern of the third protection structure.

6. The semiconductor structure according to claim 1, further comprising:
at least one seal ring structure located between the corner region and the device region.

7. The semiconductor structure according to claim 6, wherein the seal ring structure surrounds the device region.

8. The semiconductor structure according to claim 6, wherein a top-view shape of an edge profile of the seal ring structure comprises an octagon.

9. The semiconductor structure according to claim 1, further comprising:
dummy insertion structures located in an empty region of the device region.

10. The semiconductor structure according to claim 1, wherein two adjacent square top-view patterns have the same size.

11. The semiconductor structure according to claim 1, wherein a top-view shape of the corner region comprises a triangle.

12. The semiconductor structure according to claim 1, further comprising:
dummy insertion structures located in the corner region.

13. The semiconductor structure according to claim 12, wherein the dummy insertion structure is located between the protection structure and the device region.

14. The semiconductor structure according to claim 12, wherein a size of a top-view pattern of the dummy insertion structure is smaller than the size of the square top-view pattern of the protection structure.

15. The semiconductor structure according to claim 1, wherein the substrate further comprises a scribe line region, and the scribe line region is located outside the die region.

16. The semiconductor structure according to claim 15, further comprising:
dummy insertion structures located in an empty region of the scribe line region.

17. The semiconductor structure according to claim 15, further comprising:
an alignment mark located in the scribe line region.

18. The semiconductor structure according to claim 17, wherein the alignment mark is adjacent to the corner region.

* * * * *